United States Patent
Li

(10) Patent No.: US 9,518,344 B1
(45) Date of Patent: Dec. 13, 2016

(54) MASK, METHOD OF MANUFACTURING A MASK AND METHOD OF MANUFACTURING AN OLED PANEL

(71) Applicant: Shenzhen China Star Optoelectronics Technology Co., Ltd., Shenzhen, Guangdong (CN)

(72) Inventor: Jinchuan Li, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/227,895

(22) Filed: Aug. 3, 2016

Related U.S. Application Data

(62) Division of application No. 14/406,216, filed on Dec. 7, 2014, now Pat. No. 9,437,837.

(51) Int. Cl.
*H01L 21/00* (2006.01)
*D04B 17/04* (2006.01)
*H01L 51/56* (2006.01)
*H01L 51/52* (2006.01)

(52) U.S. Cl.
CPC ........... *D04B 17/04* (2013.01); *H01L 51/5246* (2013.01); *H01L 51/56* (2013.01)

(58) Field of Classification Search
CPC .. H01L 51/5246; H01L 51/56; H01L 27/3244; H01L 51/0034
See application file for complete search history.

(56) References Cited

U.S. PATENT DOCUMENTS 9,437,837 B2 * 9/2016 Li ....................... H01L 51/5246

* cited by examiner

*Primary Examiner* — Richard Booth
(74) *Attorney, Agent, or Firm* — Andrew C. Cheng

(57) ABSTRACT

Provided are a mask, a method for manufacturing a mask, and a method for manufacturing an OLED panel. The method of manufacturing a mask includes: providing a metal plate; defining a first blocking area, a second blocking area and a coating area located between the first blocking area and the second blocking area; reducing a thickness of the coating area; and intervally hollowing the coating area to thereby form skeletons which are intervally disposed and connected between the first blocking area and the second blocking area and hollowing areas which are surrounded by the first blocking area, the second blocking area and the skeletons. Such a process helps improve the production yield.

5 Claims, 3 Drawing Sheets

MASK, METHOD OF MANUFACTURING A MASK AND METHOD OF MANUFACTURING AN OLED PANEL

CROSS REFERENCE TO RELATED APPLICATIONS

This is a divisional application of co-pending patent application Ser. No. 14/406,216, filed on Dec. 7, 2014.

BACKGROUND OF THE INVENTION

1. Technical Field

The present invention relates to the field of display technology, and particularly to a mask, a method of manufacturing a mask, and a method of manufacturing an OLED panel.

2. Description of Related Art

Owing to the OLED (Organic Light-Emitting Diode) device has the advantages of self-emissive, fast response speed, flexible and ultra-thin, etc., the major manufactures in the world have continued to invest capital and technology in the OLED device field for research and the technology has reached mass production, and the market demand is increasing rapidly.

Since the OLED is sensitive to moisture and oxygen, if moisture or oxygen penetrates into the OLED device, it would corrode the organic functional layer and electrode material of the OLED device and thereby seriously affect the lifespan of the OLED device. Therefore, in order to prolong the lifespan of an OLED device and increase the stability of an OLED device, it is necessary to perform a packaging process to the OLED device so as to form an OLED package structure. A conventional packaging method is to coat a glass paste on a packaging cover (also referred to as a substrate) by dispensing or screen printing, so as to achieve the purpose of packaging the OLED device.

However, the conventional dispensing method is slow in speed and the pressure of dispensing is difficult to control, which would easily cause discontinuous dispensing, excessive dispensing or insufficient dispensing, and thereby result in the drawback of poor package quality. The screen printing method although can increase the coating speed, the screen printing plate has the drawbacks of the screen being easily broken, short lifespan, the screen wholly being not in a same plane, and cross-shaped prints usually left on the glass, and thus also would cause poor package quality.

SUMMARY

Accordingly, a technical problem primarily to be solved by the present invention is to provide a mask, a method of manufacturing a mask and a method of manufacturing an OLED panel, so as to improve the drawback of poor package quality in the related art.

In order to solve the above technical problem, a technical solution proposed by the present invention is to provide a method of manufacturing a mask. The method includes the following steps: providing a metal plate; defining a first blocking area, a second blocking area and a coating area located between the first blocking area and the second blocking area on the metal plate; reducing a thickness of the coating area to thereby make the thickness of the coating area less than that of the first blocking area and the second blocking area; performing an intervally hollowing processing on the coating area to thereby make the coating area formed with skeletons which are intervally disposed and connected between the first blocking area and the second blocking area and hollowing areas which are surrounded by the first blocking area, the second blocking area and the skeletons; providing a frame and installing the hollowing processed metal plate onto the frame to thereby obtain the mask. Moreover, the step of reducing a thickness of the coating area includes: etching the coating area to thereby etch off a part of the coating area along a thickness direction of the coating area.

In an exemplary embodiment, the step of etching the coating area includes: single-sided etching or double-sided etching of the coating area.

In an exemplary embodiment, the step of performing an intervally hollowing processing on the coating area includes: performing the intervally hollowing processing on the coating area by etching or laser cutting.

In an exemplary embodiment, before installing the hollowing processed metal plate onto the frame, the method further includes: removing burrs on the metal plate to smooth edges of the metal plate after being cut or etched.

In order to solve the above technical problem, another technical solution proposed by the present invention is to provide a method of manufacturing a mask. The method includes the following steps: providing a metal plate; defining a first blocking area, a second blocking area and a coating area located between the first blocking area and the second blocking area on the metal plate; reducing a thickness of the coating area to thereby make the thickness of the coating area less than that of the first blocking area and the second blocking area; intervally hollowing the coating area to thereby make the coating area formed with skeletons which are intervally disposed and connected between the first blocking area and the second blocking area and hollowing areas which are surrounded by the first blocking area, the second blocking area and the skeletons.

In an exemplary embodiment, the method further includes: providing a frame and installing the hollowing processed metal plate onto the frame to thereby obtain the mask.

In an exemplary embodiment, the step of reducing a thickness of the coating area includes: etching the coating area to thereby etch off a part of the coating area along a thickness direction of the coating area.

In an exemplary embodiment, the step of etching the coating area includes: single-sided etching or double-sided etching of the coating area.

In an exemplary embodiment, the step of intervally hollowing the coating area includes: intervally hollowing the coating area by etching or laser cutting.

In an exemplary embodiment, before installing the hollowing processed metal plate onto the frame, the method further includes: removing burrs on the metal plate to smooth edges of the metal plate after being cut or etched.

In order to solve the above technical problem, still another solution proposed by the present invention is to provide a mask. The mask includes a metal plate and a frame. The metal plate includes a first blocking area, a second blocking area and a coating area located between the first blocking area and the second blocking area. The coating area includes skeletons which are intervally disposed and connected between the first blocking area and the second blocking area and hollowing areas surrounded by the first blocking area, the second blocking area and the skeletons. A thickness of the skeletons is less than that of the first blocking area and the second blocking area. The metal plate is installed onto the frame.

In an exemplary embodiment, the skeletons are formed by single-sided etching or double-sided etching.

In an exemplary embodiment, the hollowing areas are formed by etching or laser cutting.

In order to solve the above technical problem, even still another technical solution proposed by the present invention is to provide a method of manufacturing an OLED panel. The method includes: providing a first substrate; disposing a mask on the first substrate, the mask plate including a metal plate and a frame, the metal plate including a first blocking area, a second blocking area and a coating area located between the first blocking area and the second blocking area, the coating area including skeletons which are intervally disposed and connected between the first blocking area and the second blocking area and hollowing areas which are surrounded by the first blocking area, the second blocking area and the skeletons, a thickness of the skeletons being less than that of the first blocking area and the second blocking area, the metal plate being installed onto the frame; coating a glass paste on the first substrate through the hollowing areas and making the glass paste flow between the skeletons and the first substrate; removing the mask; and laminating a second substrate on the first substrate and using the glass paste to fix the second substrate on the first substrate.

In an exemplary embodiment, the skeletons are formed by single-sided etching or double-sided etching.

In an exemplary embodiment, the hollowing areas are formed by etching or laser cutting.

Beneficial effects can be achieved by the present invention are that: different from the case of prior art, the present invention reduces the thickness of the coating area to thereby make the thickness of the coating area less than that of the first blocking area and the second blocking area, then performs an intervally hollowing processing on the coating area to thereby make the coating area formed with skeletons which are intervally disposed and connected between the first blocking area and the second blocking area and hollowing areas which are surrounded by the first blocking area, the second blocking area and the skeletons. By adopting the above solution, the thickness of the skeletons is made less than that of the first blocking area and the second blocking area, and the phenomenon of partial hollowing appears on the skeletons, so that when coating a glass paste, some of the glass paste will flow to the locations of the skeletons, the amount of glass paste remains at the locations of the skeletons is increased, and therefore there is enough glass paste at the locations of the skeletons to ensure keeping in a same horizontal position with the glass paste in the hollowing areas when laminating substrates. As a result, it would not produce a gap between the substrates during sintering, and the production yield is improved.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description are only some embodiments of the invention, and the ordinary skill in the art can obtain other drawings according to these illustrated drawings without creative effort. In the drawings.

DETAILED DESCRIPTION OF EMBODIMENTS

In the following, with reference to accompanying drawings of embodiments of the present invention, technical solutions in the embodiments of the present invention will be clearly and completely described. Apparently, the embodiments of the present invention described below are only some embodiments of the present invention, but not all embodiments. Based on the described embodiments of the present invention, all other embodiments obtained by persons having ordinary skill in the art without creative effort belong to the scope of protection of the present invention.

Figure 1:
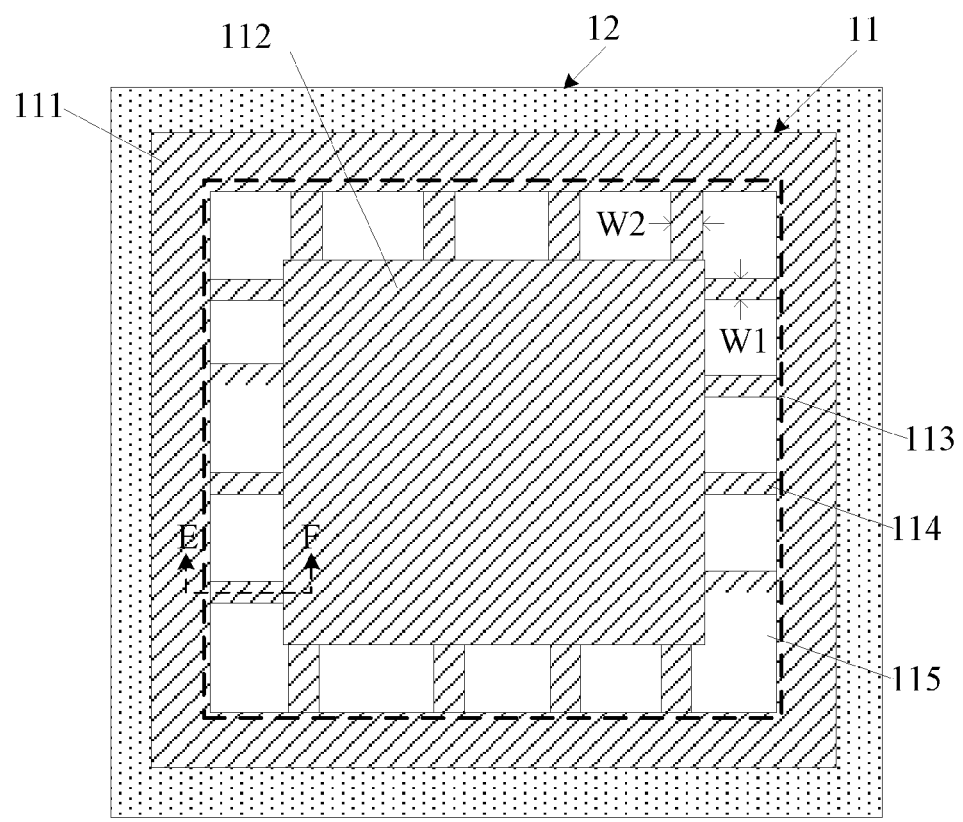
FIG. 1 is a schematic structural view of a mask according to an embodiment of the present invention.
Figure 2:
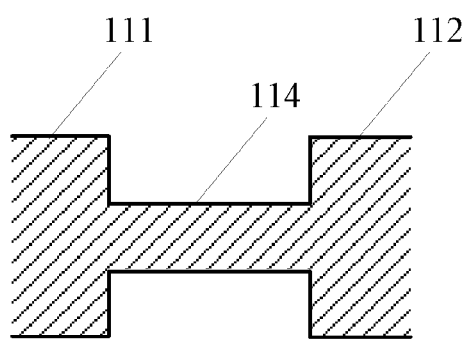
FIG. 2 is a schematic cross-sectional view of the mask as shown in FIG. 1, taken along a dashed line EF.

FIG. 1 is schematic structural view of a mask according to an embodiment of the present invention. As shown in FIG. 1, the mask 10 in this embodiment includes a metal plate 11. The metal plate 11 includes a first blocking area 111, a second blocking area 112, and a coating area 113 located between the first blocking area 111 and the second blocking area 112. The coating area 113 includes skeletons 114 and hollowing areas 115. The skeletons are intervally disposed and connected between the first blocking area 111 and the second blocking area 112. The hollowing areas 115 are surrounded by the first blocking area 111, the second blocking area 112 and the skeletons 114. A thickness of the skeletons 114 is less than a thickness of the first blocking area 111 and the second blocking area 112, as illustrated in FIG. 2.

The mask 10 further includes a frame 12, and the metal plate 11 is installed onto the frame 12. The frame 12 is disposed at the periphery of the metal plate 11, i.e., the periphery of the first blocking area 111, so as to avoid hindering a coating operation of the coating area 113 of the metal plate 11.

Accordingly, in this embodiment, by setting the thickness of the skeletons 114 to be less than that of the first blocking area 111 and the second blocking area 112 and achieving partial hollowing appearing on the skeletons 114, when a glass paste is coated, some of the glass paste will flow to the locations of the skeletons 114, and the amount of glass paste remains at the location of the skeletons 114 is increased, and therefore there is enough glass paste at the locations of the skeletons 114 to ensure keeping in a same horizontal position with the glass paste in the hollowing areas 115 when laminating substrates. As a result, it would not produce a gap between the laminated substrates during sintering, and the production yield is improved.

In this embodiment, the frame 12 preferably is stainless steel, and the metal plate 11 preferably is a stainless steel sheet or a metal alloy sheet and a material thereof is SUS304 or INVAR36, or other similar metal sheet. A thickness of the metal plate 11 may be in the range from 0.02 millimeters (mm) to 0.5 mm. A minimum thickness of the coated glass paste can reach 0.004-0.006 mm. A height of the metal plate 11 can be adjusted by using different thickness of metal plate according to actual demand.

The skeletons are preferably formed by etching. The hollowing areas 15 are formed by etching or laser cutting. Specifically speaking, firstly, the coating area 113 is etched (first etching) to thereby etch off a part of the coating area 113 along the thickness direction of the coating area 113, and the etched coating area is then intervally etched (second etching) or laser cut for hollowing processing. s a result, the skeletons 114 and the hollowing areas 115 are obtained.

Furthermore, when performing the first etching on the coating area 113 to etch off the part of the coating area 113 along the thickness direction of the coating area 113, the coating area 113 may be single-side etched or double-side etched to thereby obtain single-side etched or double-side etched skeletons 114. The skeletons 114 as illustrated in FIG. 2 are double-side etched skeletons, and heights of two sides thereof are lower than that of the first blocking area 111 and the second blocking area 112.

Widths of the skeletons 114 in this embodiment are in the range from several micrometers to several hundred micrometers, the widths and numbers/amounts of the skeletons 114 can be set based on the tensile force of the metal plate 11. In the situation where the tensile force of the metal plate 11 is given, if the amount of the skeletons 114 is large, the widths of the skeletons 114 would be set narrow, vice versa.

In addition, the positions of the skeletons 114 in the metal plate may be completely symmetrically disposed, or staggeredly disposed, and thus are disposed based on actual demand. Likewise, in the metal plate 11, the widths of the skeletons 114 may be completely the same, and also can set the skeletons 114 with different widths according to the tensile force of the metal plate 11 and the distribution of the hollowing areas 115. As illustrated in FIG. 1, the skeletons 114 have two thicknesses W1 and W2.

Before installing the hollowing processed metal plate 11 onto the frame 12, burrs on the metal plate 11 would be removed off so as to smooth the edges of the cut or etched metal plate 11. Specifically, the burrs on the metal plate 11 can be removed by chemical electropolishing.

A specific operation of installing the hollowing processed metal plate 11 onto the frame 12 is that: firstly, the metal plate 11 is aligned with the frame 12, the aligned metal plate 11 and frame 12 are then welded by laser welding, and afterwards, the part of the metal plate 11 overlaying the frame 12 is cut off to thereby make the frame 12 located at the periphery of the metal plate 11.

As described in the foregoing, by setting the thickness of the skeletons 114 to be less than that of the first blocking area 111 and the second blocking area 112, when coating a glass paste, the amount of glass paste at the location of the skeletons 114 can be increased, so that it would not produce a gap between laminated substrates during sintering and thus the production yield is improved.

Based on the foregoing mask 10, the present invention further provides a method of manufacturing the mask 10. For details, please refer to FIG. 3.

Figure 3:
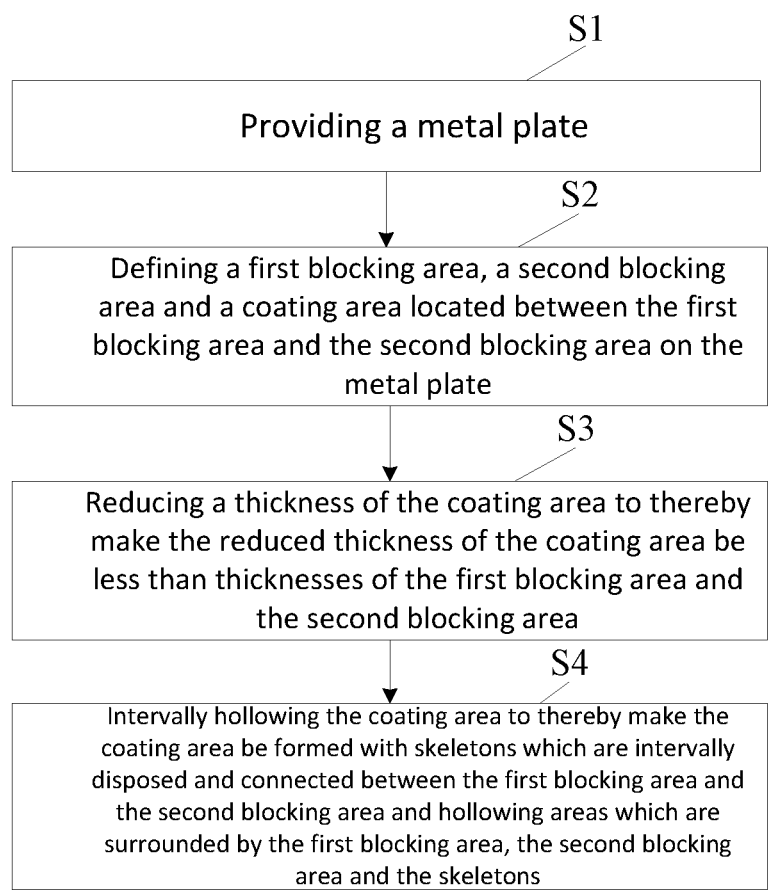
FIG. 3 is a flowchart of a method of manufacturing a mask according to an embodiment of the present invention.

As shown in FIG. 3, the method of manufacturing the mask 10 according to the present invention includes the following steps:

Step S1: providing a metal plate 11.

In the step S1, the metal plate 11 is preferably a stainless steel sheet or a metal alloy sheet and a material thereof is SUS304 or INVAR36, or other similar metal sheet. A thickness of the metal plate 11 may be in the range from 0.02 mm to 0.5 mm.

The metal plate 11 is selected to manufacture the mask 10, which can effectively prolong the lifespan of the mask 10. Moreover, the metal plate 11 is wholly located at a same plane, which would not cause a substrate to crush as well as not cause the left of cross-shaped prints during coating a glass paste on the substrate, good looks is achieved and the production yield is improved.

Step S2: defining a first blocking area 111, a second blocking area 112 and a coating area 113 located between the first blocking area 111 and the second blocking area 112 on the metal plate 11.

The first blocking area 111 is located at the outermost position of the metal plate 11 with respect to the second blocking area 112 and the coating area 113.

Step S3: reducing a thickness of the coating area 113 to thereby make the thickness of the coating area 113 less than that of the first blocking area 111 and the second block area 112.

In the step S3, specifically, the coating area 113 is etched so as to etch off a part of the coating area along the thickness direction of the coating area 113. Furthermore, in this step, the coating area 113 is single-side etched or double-side etched so that the thickness of single side or double sides of the coating area 113 is partially etched. When the double-sided etching is performed, the cross-sectional view of resultant coating area 113 is illustrated in FIG. 2.

Step S4: intervally hollowing the coating area 113 to thereby make the coating area 113 formed with skeletons which are intervally disposed and connected between the first blocking area 111 and the second blocking area 112 and hollowing areas 115 which are surrounded by the first blocking area 111, the second blocking area 112 and the skeletons 114.

In the step S4, specifically, the intervally hollowing of the coating area 113 is performed by etching or laser cutting.

After the hollowing of the coating area 113, burrs on the metal plate 11 is removed to smooth edges of the metal plate 11 after being cut or etched. Specifically, the burrs on the metal plate 11 may be removed by chemical electropolishing.

Moreover, this embodiment may further include a step of providing a frame 12 and installing the hollowing processed metal plate 11 onto the frame 12 to thereby obtain the mask 10. The frame 12 is located at the periphery of the metal plate 11, so as to avoid hindering a coating operation of the coating area 113 of the metal plate 11.

A concrete operation of installing the hollowing processed metal plate 11 onto the frame 12 is that: firstly, aligning the metal plate 11 with the frame 12, then using a laser welding method to weld the aligned metal plate 11 and the frame 12 together, and afterwards cutting off the part of the metal plate overlaying the frame 12 to thereby make the frame 12 located at the periphery of the metal plate 11.

Based on the foregoing mask 10, the present invention still further provides a method of manufacturing an OLED panel. For details, please refer to FIG. 4.

Figure 4:
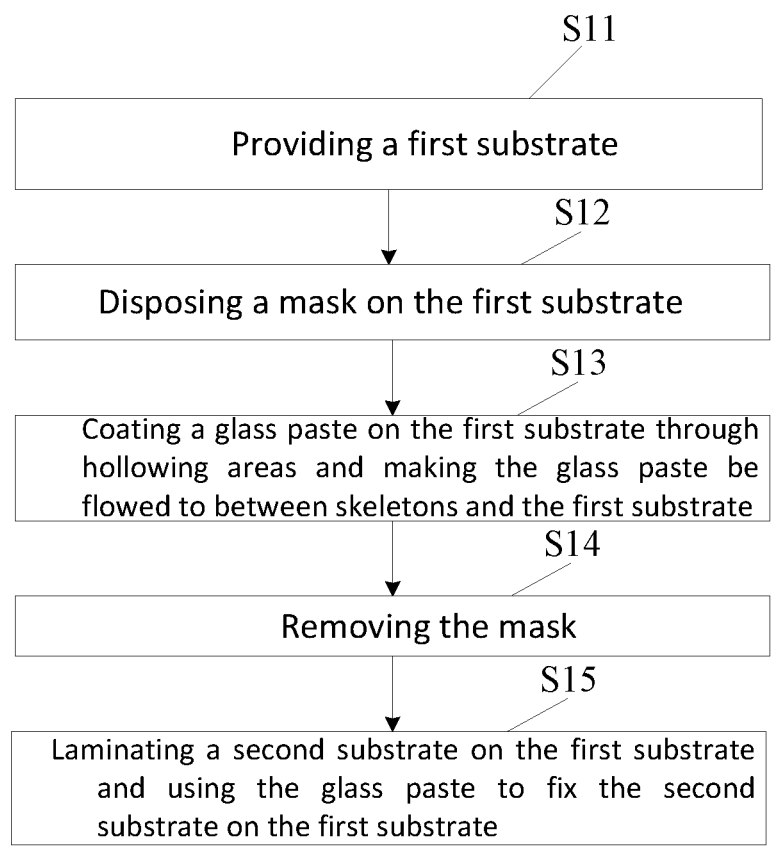
FIG. 4 is a flowchart of a method of manufacturing an OLED panel according to an embodiment of the present invention.

As shown in FIG. 4, the method of manufacturing an OLED panel in this embodiment includes the following steps:

Step S11: providing a first substrate, the first substrate including a display area and a non-display area.

Step S12: disposing a mask 10 on the first substrate.

The first blocking area 111 and the second blocking area 112 are both disposed in the non-display area of the first substrate, and the hollowing areas 115 of the mask 10 are aligned with the display area of the first substrate. Accordingly, light emitting elements of the display area can be packaged by use of the hollowing areas 115.

Step S13: coating a glass paste on the first substrate through the hollowing areas 115 and making the glass paste flow between the skeletons 114 and the first substrate. Accordingly, there is glass paste remaining at the location of the skeletons 114, and the glass paste remaining at the location of the skeletons 114 and the glass paste at the location of the hollowing areas 115 are in a same horizontal plane.

Step S14: removing the mask 10.

Step S15: laminating a second substrate on the first substrate and using the glass paste to fix the second substrate onto the first substrate.

Since in the step S13, the locations of the hollowing areas 115 and the skeletons 114 are both coated with the glass paste, and it would not produce a gap between the first substrate and the second substrate, and therefore the production yield is improved.

In summary, the present invention sets the thickness(es) of the skeletons to be less than that of the first blocking area 111 and the second blocking area 112 and partial hollowing appears on the skeletons 114, so that when a glass paste is coated, some of the glass paste will flow to the locations of the skeletons 114, and the amount of glass paste remaining at the locations of the skeletons 114 is increased, and therefore there is enough glass paste at the location of the skeletons 114 to ensure keeping in a same horizontal position with the glass paste in the hollowing areas 115 when laminating the second substrate on the first substrate. As a result, it would not produce a gap between the first substrate and the second substrate during sintering, and the production yield is improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing an OLED (organic light emitting diode) panel, comprising steps of:

providing a first substrate;
disposing a mask on the first substrate, the mask comprising:
　a metal plate, wherein the metal plate comprises a first blocking area, a second blocking area and a coating area located between the first blocking area and the second blocking area, the coating area including skeletons which are intervally disposed and connected between the first blocking area and the second blocking area and hollowing areas which are surrounded by the first blocking area, the second blocking area and the skeletons, a thickness of the skeletons being less than that of the first blocking area and the second blocking area; and
　a frame, wherein the metal plate is installed onto the frame;
coating a glass paste on the first substrate through the hollowing areas and making the glass paste flow to between the skeletons and the first substrate;
removing the mask; and
laminating the second substrate on the first substrate and using the glass paste to fix the second substrate onto the first substrate.

2. The method according to claim 1, wherein the skeletons are formed by single-sided etching or double-sided etching.

3. The method according to claim 1, wherein the hollowing areas are formed by etching or laser cutting.

4. The method according to claim 1, wherein the first substrate comprises a display area and a non-display area, the first blocking area and the second blocking area of the metal plate being disposed in the non-display area, the hollowing areas being aligned with the display area.

5. The manufacturing method as method according to claim 1, wherein the frame is located at a periphery of the metal plate.

* * * * *